United States Patent
Hwang et al.

(10) Patent No.: US 9,299,716 B2
(45) Date of Patent: Mar. 29, 2016

(54) METHODS OF MANUFACTURING A SEMICONDUCTOR DEVICE

(71) Applicant: Samsung Electronics Co., Ltd., Suwon-Si, Gyeonggi-Do (KR)

(72) Inventors: Sung-Min Hwang, Seoul (KR); Han-Soo Kim, Suwon-si (KR); Woon-Kyung Lee, Seongnam-si (KR); Won-Seok Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/790,724

(22) Filed: Jul. 2, 2015

(65) Prior Publication Data

US 2015/0311213 A1 Oct. 29, 2015

Related U.S. Application Data

(63) Continuation of application No. 14/156,781, filed on Jan. 16, 2014, now Pat. No. 9,087,861.

(30) Foreign Application Priority Data

Jan. 17, 2013 (KR) .......................... 10-2013-0005514

(51) Int. Cl.
*H01L 29/792* (2006.01)
*H01L 27/115* (2006.01)
*H01L 29/66* (2006.01)

(52) U.S. Cl.
CPC ...... *H01L 27/1157* (2013.01); *H01L 27/11573* (2013.01); *H01L 27/11575* (2013.01); *H01L 27/11582* (2013.01); *H01L 29/66833* (2013.01); *H01L 29/7926* (2013.01)

(58) Field of Classification Search
CPC ................. H01L 27/11582; H01L 27/11556; H01L 29/66833; H01L 29/7926
USPC ......................................................... 257/326
See application file for complete search history.

(56) References Cited

U.S. PATENT DOCUMENTS

| | | | |
|---|---|---|---|
| 7,989,880 B2 | 8/2011 | Wada et al. | |
| 8,268,687 B2 | 9/2012 | Hyun et al. | |
| 2007/0158736 A1 | 7/2007 | Arai et al. | |
| 2007/0252201 A1 | 11/2007 | Kito et al. | |
| 2008/0149913 A1 | 6/2008 | Tanaka et al. | |
| 2009/0230449 A1* | 9/2009 | Sakaguchi | H01L 27/0688 257/298 |
| 2010/0097859 A1* | 4/2010 | Shim | G11C 5/02 365/185.05 |
| 2010/0133599 A1 | 6/2010 | Chae et al. | |
| 2010/0207186 A1 | 8/2010 | Higashi et al. | |

(Continued)

*Primary Examiner* — Karen Kusumakar
(74) *Attorney, Agent, or Firm* — Harness, Dickey & Pierce, P.L.C.

(57) ABSTRACT

A method of manufacturing a vertical type memory device includes stacking a first lower insulating layer, one layer of a lower sacrificial layer and a second lower insulating layer on a substrate, forming a stacking structure by stacking sacrificial layers and insulating layers, and etching an edge portion of the stacking structure to form a preliminary stepped shape pattern structure. The preliminary stepped shape pattern structure has a stepped shape edge portion. A pillar structure making contact with a surface of the substrate is formed. The preliminary stepped shape pattern structure, the lower sacrificial layer, and the first and second lower insulating layers are partially etched to form a first opening portion and a second opening portion to form a stepped shape pattern structure. The second opening portion cuts at least an edge portion of the lower sacrificial layer.

20 Claims, 17 Drawing Sheets

(56) References Cited

U.S. PATENT DOCUMENTS

| | | |
|---|---|---|
| 2010/0315875 A1 | 12/2010 | Kim et al. |
| 2010/0323505 A1 | 12/2010 | Ishikawa et al. |
| 2011/0147801 A1 | 6/2011 | Shim et al. |
| 2011/0151667 A1 | 6/2011 | Hwang et al. |
| 2011/0156132 A1 | 6/2011 | Kiyotoshi |
| 2011/0180941 A1 | 7/2011 | Hwang et al. |
| 2011/0199804 A1 | 8/2011 | Son et al. |
| 2011/0201167 A1* | 8/2011 | Satonaka .......... H01L 27/11578 438/268 |
| 2011/0316069 A1 | 12/2011 | Tanaka et al. |

* cited by examiner

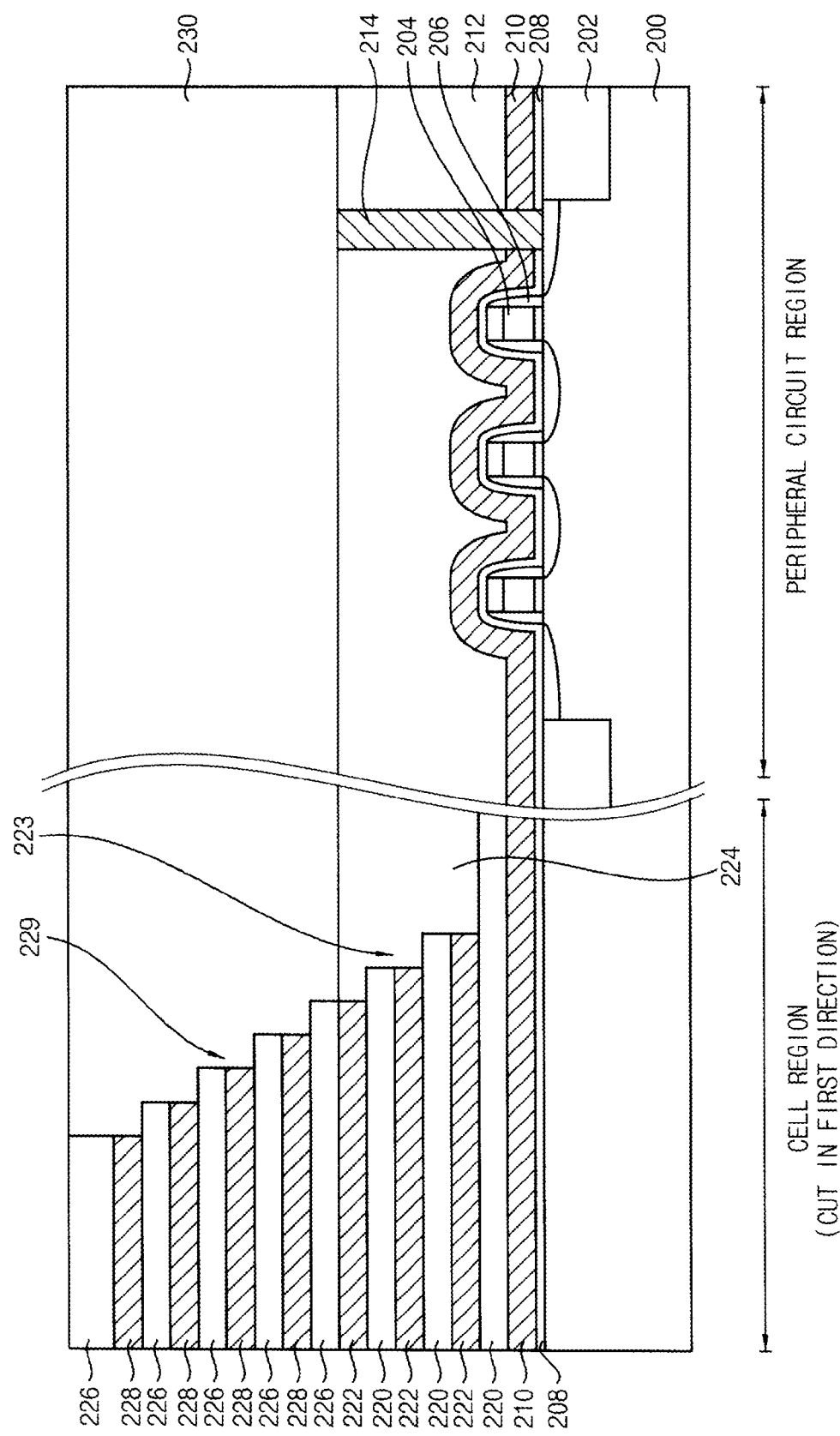

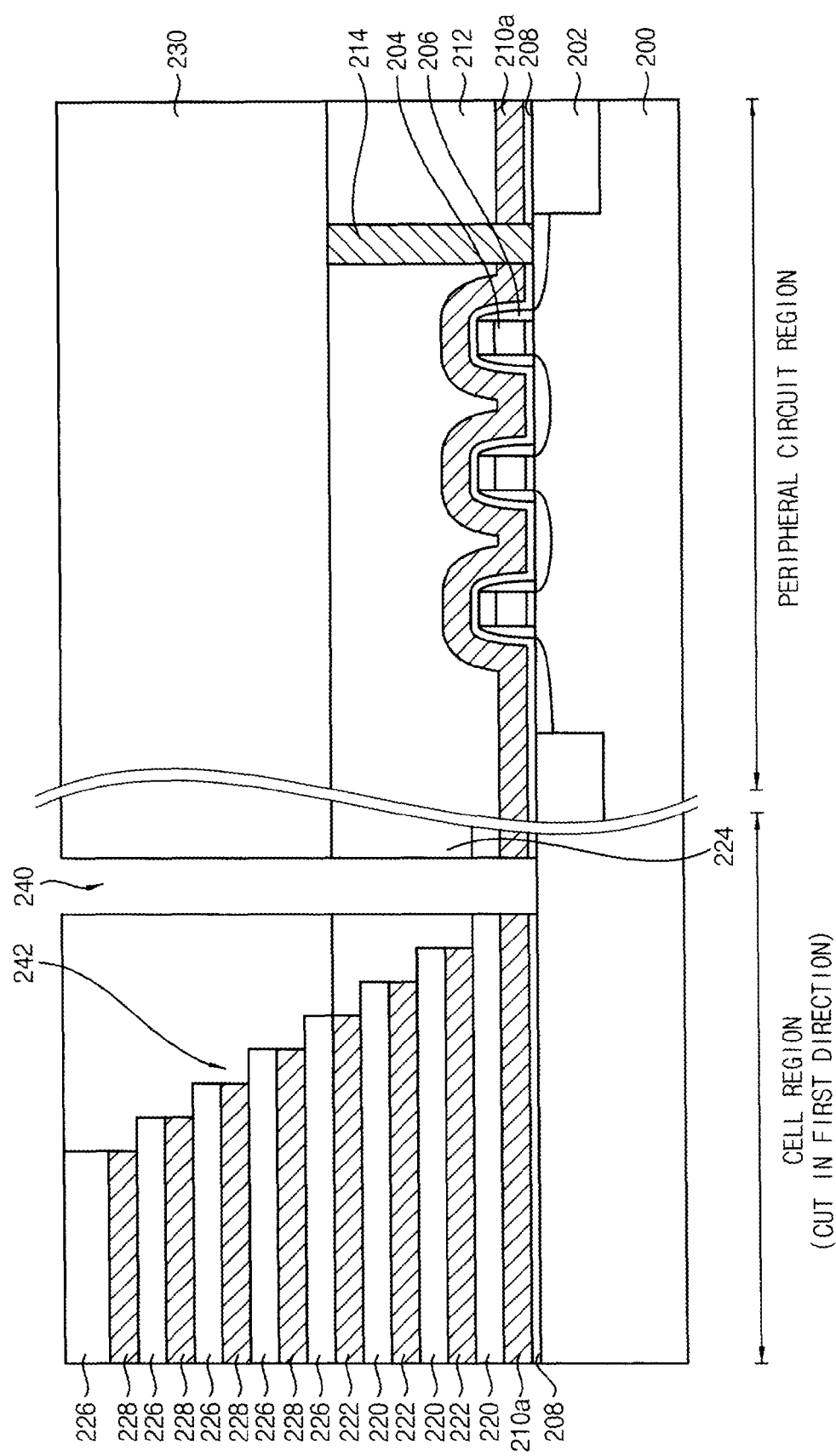

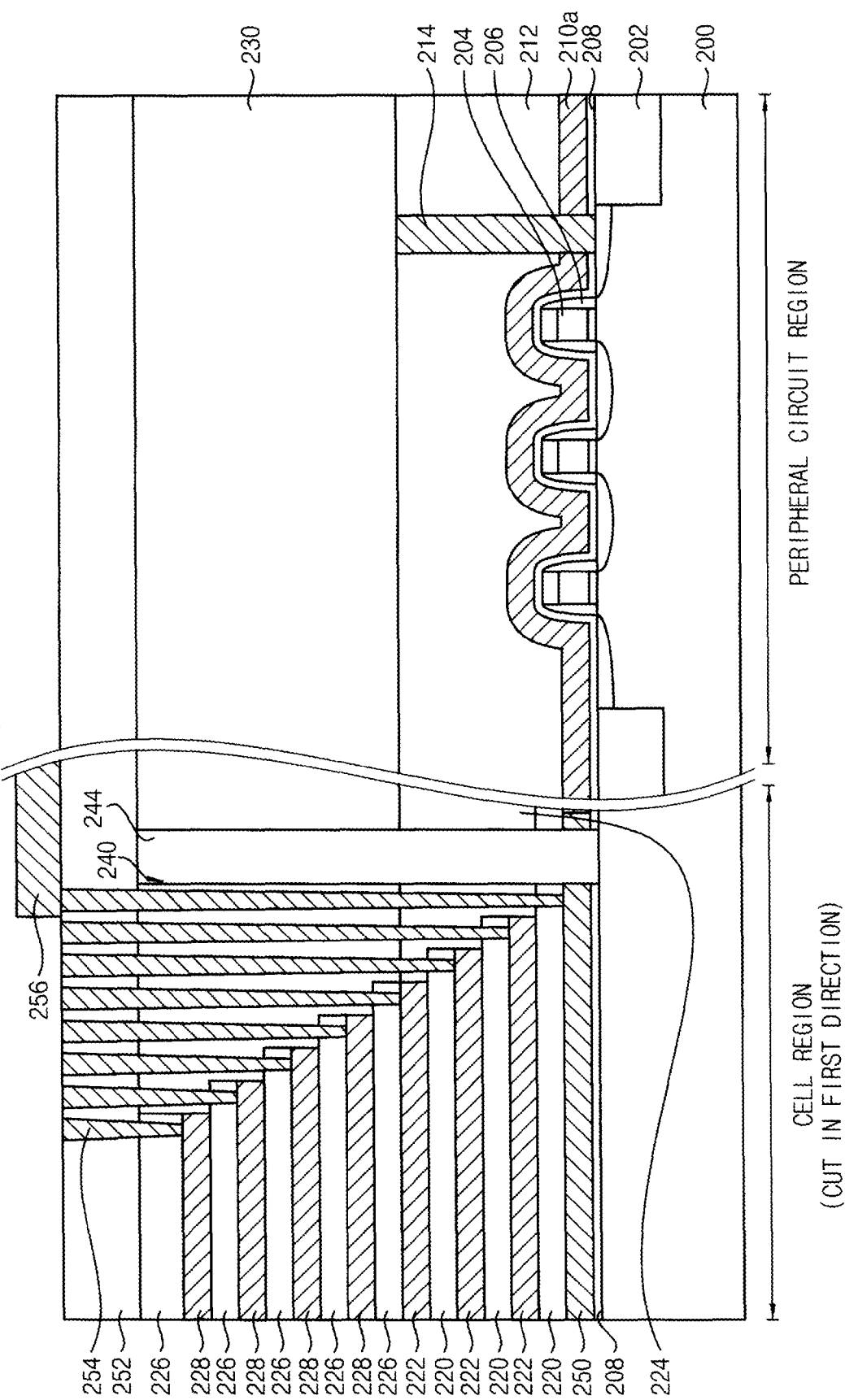

METHODS OF MANUFACTURING A SEMICONDUCTOR DEVICE

CROSS-REFERENCE TO RELATED APPLICATION

This application is a continuation of U.S. patent application Ser. No. 14/156,781, filed on Jan. 16, 2014, which claims priority under 35 USC §119 to Korean Patent Application No. 10-2013-0005514, filed on Jan. 17, 2013 in the Korean Intellectual Property Office (KIPO), the entire contents of each of which are incorporated herein by reference.

BACKGROUND

1. Field

Some example embodiments relate to methods of manufacturing a semiconductor device and/or methods of manufacturing a vertical type nonvolatile memory device.

2. Description of the Related Art

Recently, technologies on stacking cells in a vertical direction with respect to the surface of a substrate have been developed for the relatively high stacking of semiconductor devices. A vertical-type semiconductor device includes a vertically stacked structure of word lines included in each of the cells. In order to apply electric signals to each of the stacked word lines, the edge portion of the word lines may have a stepped shape for the connection with wirings. To form the stepped shape word lines, a number of photolithography processes and etching processes may be necessary. Thus, processing cost accompanied with the number of photolithography processes and the etching processes may be increased.

SUMMARY

Some example embodiments provide a method of manufacturing a vertical type semiconductor device by conducting relatively simple processes.

According to an example embodiment, a method of manufacturing a vertical type memory device includes stacking a first lower insulating layer, a lower sacrificial layer and a second lower insulating layer on a substrate, forming a stacking structure by alternately and repeatedly stacking sacrificial layers and insulating layers on the second lower insulating layer, etching an edge portion of the stacking structure to form a preliminary stepped shape pattern structure on the lower sacrificial layer, the preliminary stepped shape pattern structure having a stepped shape at an edge portion thereof, forming a pillar structure making contact with a surface of the substrate through the preliminary stepped shape pattern structure, the lower sacrificial layer, and the first and second lower insulating layers, the pillar structure including a channel pattern, partially etching the preliminary stepped shape pattern structure, the lower sacrificial layer, and the first and second lower insulating layers to form a stepped shape pattern structure having a first opening portion extending in a first direction and a second opening portion extending in a second direction perpendicular to the first direction, the second opening portion being formed by cutting at least an edge portion of the lower sacrificial layer, forming gaps in the stacking structure by removing the sacrificial layers and at least a portion of the lower sacrificial layer, and forming word lines and selection lines in the gaps.

In an example embodiment, the stepped shape pattern structure may include stepped shape patterns, and each of the stepped shape patterns may include one layer of the sacrificial layer and one layer of the insulating layer in the stepped shape pattern structure. In an example embodiment, the lower sacrificial layer facing the stepped shape pattern structure may be removed through a side wall of the second opening portion except for a remaining portion at a side wall of the gap. In an example embodiment, a lower dummy conductive line may be formed extending in the second direction in a lower portion of the gap facing the stepped shape pattern structure, the lower dummy conductive line having a lower sacrificial layer pattern at a side wall thereof. In an example embodiment, one end portion of the first opening portion and the second opening portion may make an interconnection to each other.

In an example embodiment, forming the word lines and selection lines in the gaps may include forming a conductive layer filling the gaps, the conductive layer including a metal, and removing the conductive layer formed in the first and second opening portions. In an example embodiment, the method may further include forming an insulating layer pattern in the first and second opening portions after removing the conductive layer. In an example embodiment, the method may further include forming an insulating spacer on a side wall in the first and second opening portions after removing the conductive layer, forming a conductive layer filling the inner portion of the first and second opening portions including the insulating spacer, the conductive layer including a metal, and planarizing the conductive layer to form a common source line and a dummy conductive line making contact with the substrate.

In an example embodiment, the method may include forming first and second contact holes in at least one of the uppermost insulating layers of the stacking structure, forming first contact plugs in the first contact holes, the first contact plugs being connected with the word lines in each of the uppermost insulating layers, forming second contact plugs in the second contact holes, the second contact plugs being connected with the selection lines, and forming wiring lines interconnecting the first contact plugs and the second contact plugs. In an example embodiment, the method may further include forming a transistor for a peripheral circuit in a peripheral region of the substrate, the first lower insulating layer and the lower sacrificial layer covering the transistor for the peripheral circuit.

According to another example embodiment, a method of manufacturing a vertical type memory device includes stacking a first lower insulating layer, a lower sacrificial layer and a second lower insulating layer on a substrate, forming a preliminary stepped shape pattern structure including repeatedly stacked sacrificial layer patterns and insulating layer patterns on the second lower insulating layer, the preliminary stepped shape pattern structure having a stepped shape edge portion, forming a pillar structure making contact with a surface of the substrate through the preliminary stepped shape pattern structure, the lower sacrificial layer, and the first and second lower insulating layers, and partially etching the preliminary stepped shape pattern structure, the lower sacrificial layer, and the first and second insulating layers to form a stepped shape pattern structure including a lowermost step, the lowermost step surrounding the pillar structure, extending in a first direction and being formed by cutting an edge portion of the lower sacrificial layer.

In another example embodiment, a first opening portion may be formed extending in the first direction and a second opening portion extending in a second direction perpendicular to the first direction, the second opening portion being separated from the preliminary stepped shape pattern structure. In another example embodiment, the method may further include removing at least a portion of the lower sacrificial layer and the sacrificial layer patterns to form gaps between the insulating layer patterns and the first and second lower insulating layers, and forming word lines and selection lines in the gaps after the partially etching. In another example embodiment, the method may further include forming a transistor for a peripheral circuit in a peripheral circuit region of the substrate, the first lower insulating layer and the lower sacrificial layer being formed to cover the transistor for the peripheral circuit. In another example embodiment, forming the pillar structure may form a channel pattern.

In yet another example embodiment, a method of manufacturing a vertical type memory device includes forming a sacrificial layer between first and second insulating layers on a substrate, forming a preliminary stepped shape pattern structure by repeatedly stacking sacrificial layer patterns and insulating layer patterns on the second insulating layer, and forming a stepped shape pattern structure by partially etching the preliminary stepped shape pattern structure, the sacrificial layer, and the first and second insulating layers, the forming a stepped shape pattern structure including cutting an edge portion of the sacrificial layer.

In yet another example embodiment, the stepped shaped pattern structure may be formed by forming a first opening portion extending in a first direction and a second opening portion extending in a second direction perpendicular to the first direction, the second opening portion being separated from the preliminary stepped shape pattern structure. In yet another example embodiment, the method may further include removing at least a portion of the sacrificial layer and the sacrificial layer patterns to form gaps between the insulating layer patterns and the first and second insulating layers, and forming word lines and selection lines in the gaps after the forming a stepped shape pattern structure.

In yet another example embodiment, the method may further include forming a pillar structure making contact with a surface of the substrate through the preliminary stepped shape pattern structure, the sacrificial layer, and the first and second insulating layers. In yet another example embodiment, the stepped shape pattern structure may include stepped shape patterns, each of the stepped shape patterns including one layer of the sacrificial layer pattern and one layer of the insulating layer pattern in the stepped shape pattern structure.

As described above, stepped shape pattern structures may be formed through conducting relatively simple processes in example embodiments. Thus, the word lines and the selection lines of a vertical type semiconductor device may be manufactured through conducting relatively simple processes. Therefore, the generation of defects while forming the word lines and the selection lines may be decreased. In addition, processing costs necessary for forming the word lines and the selection lines may be decreased.

BRIEF DESCRIPTION OF THE DRAWINGS

Example embodiments will be more clearly understood from the following detailed description taken in conjunction with the accompanying drawings. FIGS. 1 to 18 represent non-limiting, example embodiments as described herein.

FIGS. 1 to 7 are cross-sectional views for explaining a method of manufacturing a vertical type memory device in accordance with an example embodiment of the present inventive concepts;

FIGS. 8 to 10 are plan views for explaining a method of manufacturing a vertical type memory device in accordance with the example embodiment of the present inventive concepts;

FIGS. 11 and 12 are cross-sectional views for explaining a method of manufacturing a vertical type memory device in accordance with another example embodiment of the present inventive concepts; and FIGS. 13 to 18 are cross-sectional views for explaining a method of manufacturing a vertical type memory device in accordance with another example embodiment of the present inventive concepts.

DETAILED DESCRIPTION

Figure 1:
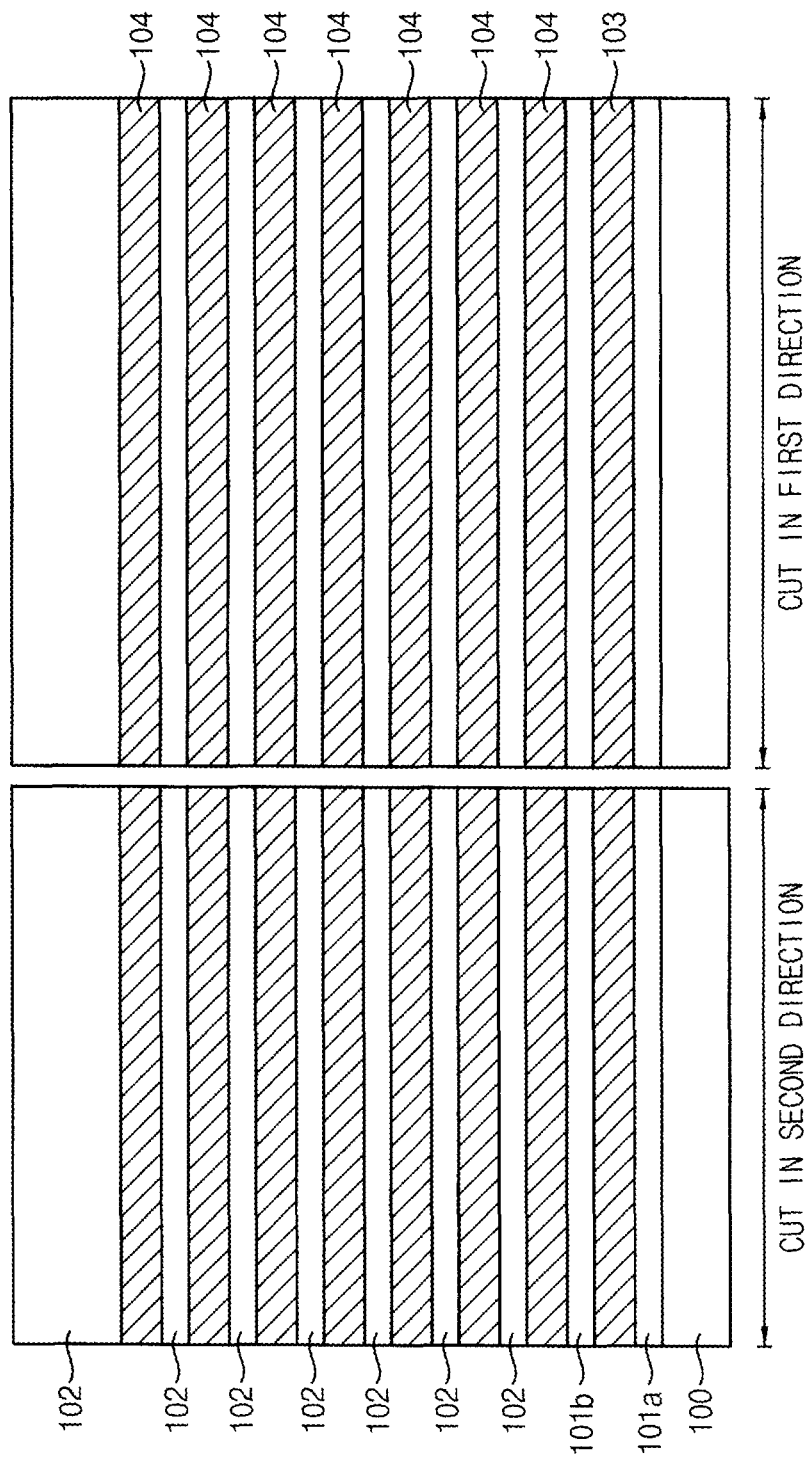

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Figure 8:
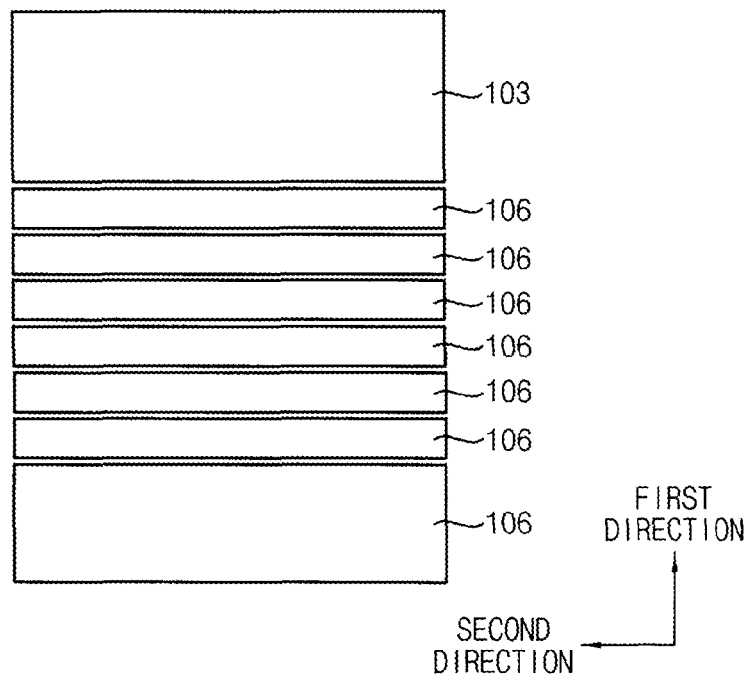
Figure 9:
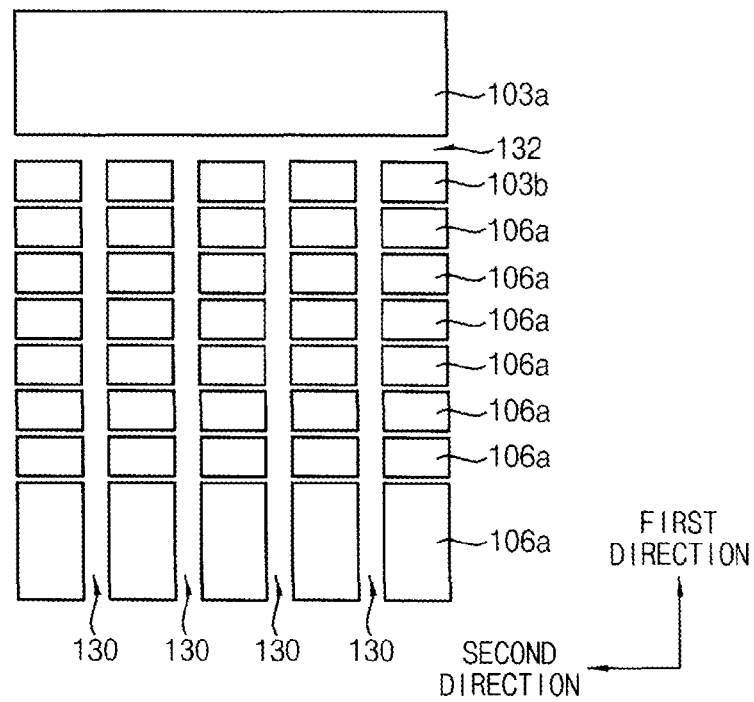
Figure 10:
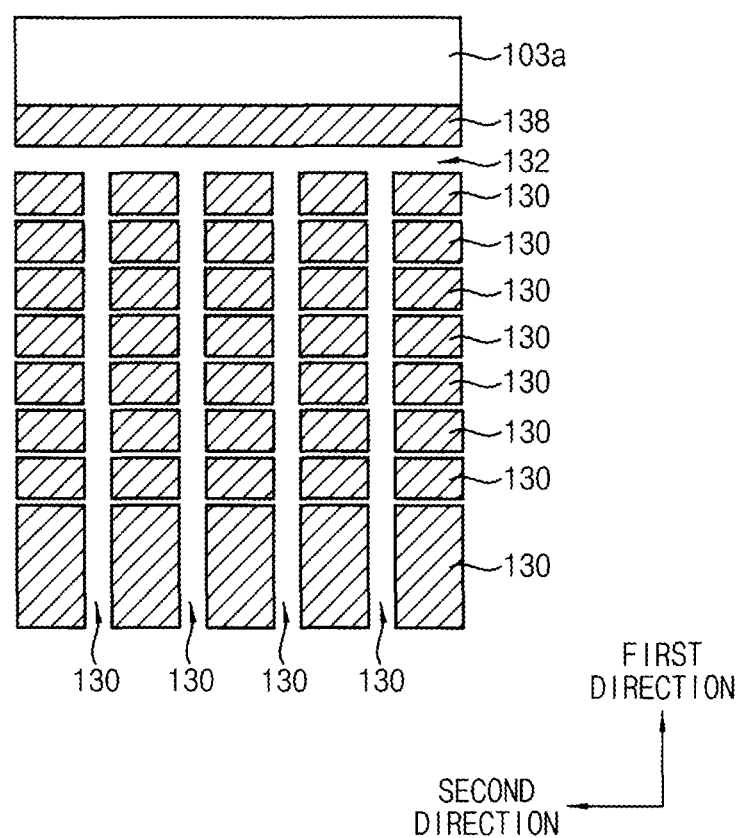

FIGS. 1 to 7 are cross-sectional views for explaining a method of manufacturing a vertical type memory device in accordance with an example embodiment of the present inventive concepts. FIGS. 8 to 10 are plan views for explaining a method of manufacturing a vertical type memory device in accordance with the example embodiment of the present inventive concepts.

Herein below, two directions in parallel to the upper surface of a substrate and perpendicular to each other will be defined as a first direction and a second direction. The first direction is an extended direction of the word line. In addition, a vertical direction to the upper surface of the substrate will be defined as a third direction. The definition on the directions will be the same throughout the drawings illustrated hereinafter.

The drawings on the left side in FIGS. 1 to 7 illustrate cell forming regions when cut in the second direction. The drawings on the right side in FIGS. 1 to 7 are the edge portions of word lines when cut in the first direction.

Referring to FIG. 1, a first lower insulating layer 101a, a lower sacrificial layer 103 and a second lower insulating layer 101b may be stacked one by one on a substrate 100. Each of the first lower insulating layer 101a, the lower sacrificial layer 103 and the second lower insulating layer 101b may be stacked by one layer. Sacrificial layers 104 and first insulation layers 102 may be alternately and repeatedly stacked on the second lower insulating layer 101b.

The substrate 100 may include a semiconductor material such as silicon, germanium, and the like. The first insulating layers 102 and the sacrificial layers 104 may be formed through a chemical vapor deposition (CVD) process, a plasma enhanced chemical vapor deposition (PECVD) process, an atomic layer deposition (ALD) process, and the like. In accordance with an example embodiment, the first insulating layers 102 may be formed by using silicon oxide, and the sacrificial layers 104 may be formed by using a material having an etching selectivity with respect to the first insulating layer 102, for example, silicon nitride.

In addition, the first and second lower insulating layers 101a and 101b may be formed by using the same material as the first insulating layers 102 and by performing the same processes. The lower sacrificial layer 103 may be formed by using the same material as the sacrificial layers 104 and by performing the same processes.

At each of the portions including the lower sacrificial layer 103 and the sacrificial layers 104, ground selection lines GSL, word lines and string selection lines SSL may be formed through performing subsequent processes. Thus, the stacking number of the lower sacrificial layer 103 and the sacrificial layers may vary according to the stacking number of the ground selection lines GSL, the word lines and the string selection lines SSL to be formed in a following process.

Figure 2:
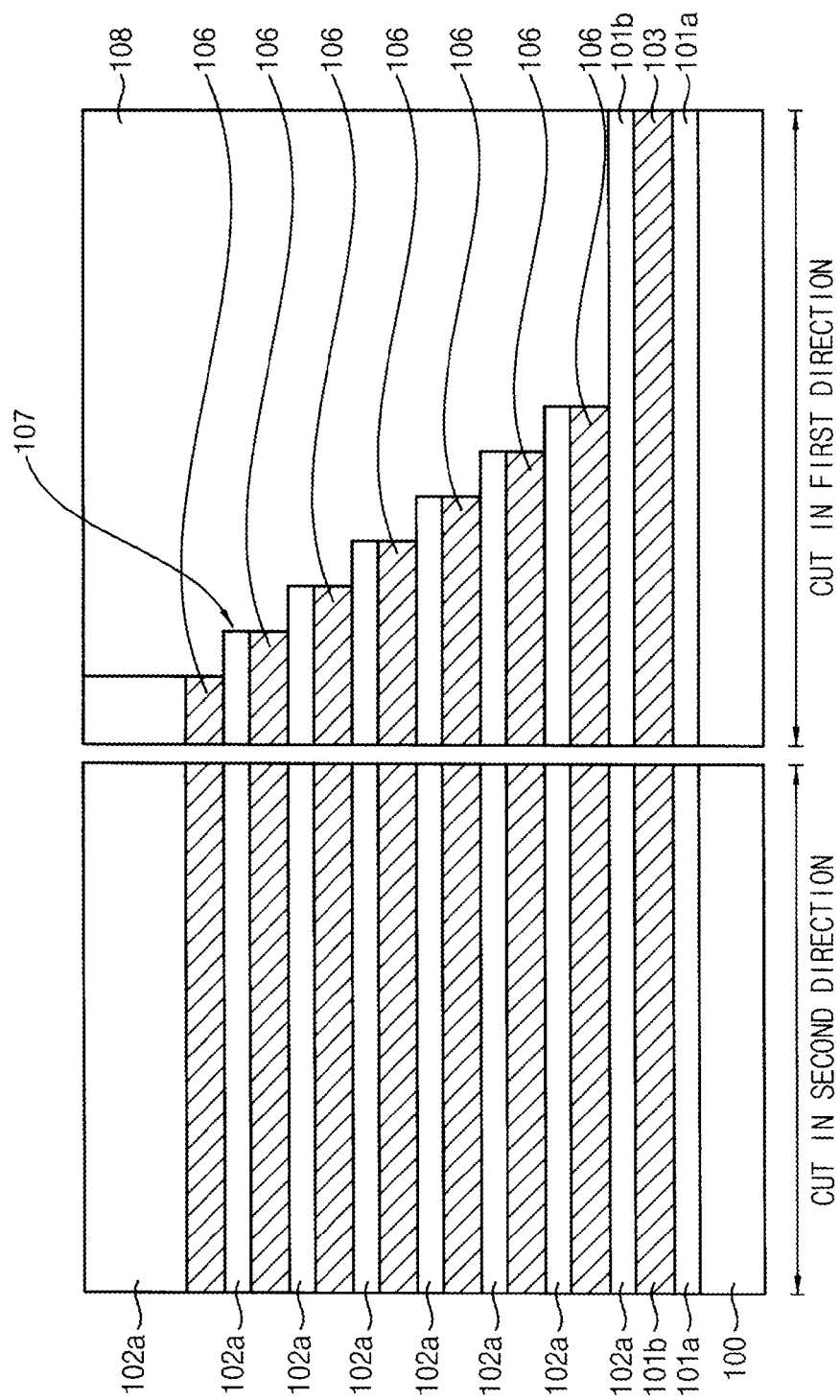

Referring to FIGS. 2 and 8, a photolithography process may be conducted with respect to the first insulating layers 102 and the sacrificial layers 104 to form a preliminary stepped shape pattern structure 107 having a stepped shape edge portion.

The preliminary stepped shape pattern structure 107 may have a stacked shape of sacrificial layer patterns 106 and first insulating layer patterns 102a. In the preliminary pattern structure 107, one stepped layer pattern may include one layer of the sacrificial layer pattern 106 and one layer of the first insulating layer pattern 102a.

While performing the etching process, the first and second lower insulating layer patterns 101a and 101b, and the lower sacrificial layer 103 may be not etched. That is, the first and second lower insulating layers 101a and 101b, and the lower sacrificial layer 103 may maintain a deposited state. Thus, the lower sacrificial layer 103 may not have the stepped shape. In addition, the preliminary stepped shape pattern structure 107 may be formed on the second lower insulating layer 101b.

In general, for performing the forming process of the stepped shape pattern structure, an etching process, a cleaning process accompanied with the etching process, and the like may be necessary whenever one step may be formed. Thus, as the stacking number of the first insulating layers and the sacrificial layers increases, the process may be more complicated, and defects may be more easily generated. In addition, as the number of the first insulating layers and the sacrificial layers increases, the number of photolithography processes necessary for forming the stepped shape pattern structure may be increased.

However, in this example embodiment, in the process of forming the preliminary stepped shape pattern structure 107, the lower sacrificial layer 103 positioned at the lowermost portion may not be etched. As described above, since the lower sacrificial layer is not patterned, the number of the processes necessary for forming the preliminary stepped shape pattern structure 107 may be decreased. Thus, the generation of the defects may be also decreased.

Subsequently, a second insulating layer 108 covering the preliminary stepped shape pattern structure 107 may be formed. The upper surface of the second insulating layer 108 may be planarized to expose the upper surface of the preliminary stepped shape pattern structure 107. The planarization process may include a chemical mechanical polishing process.

Figure 3:
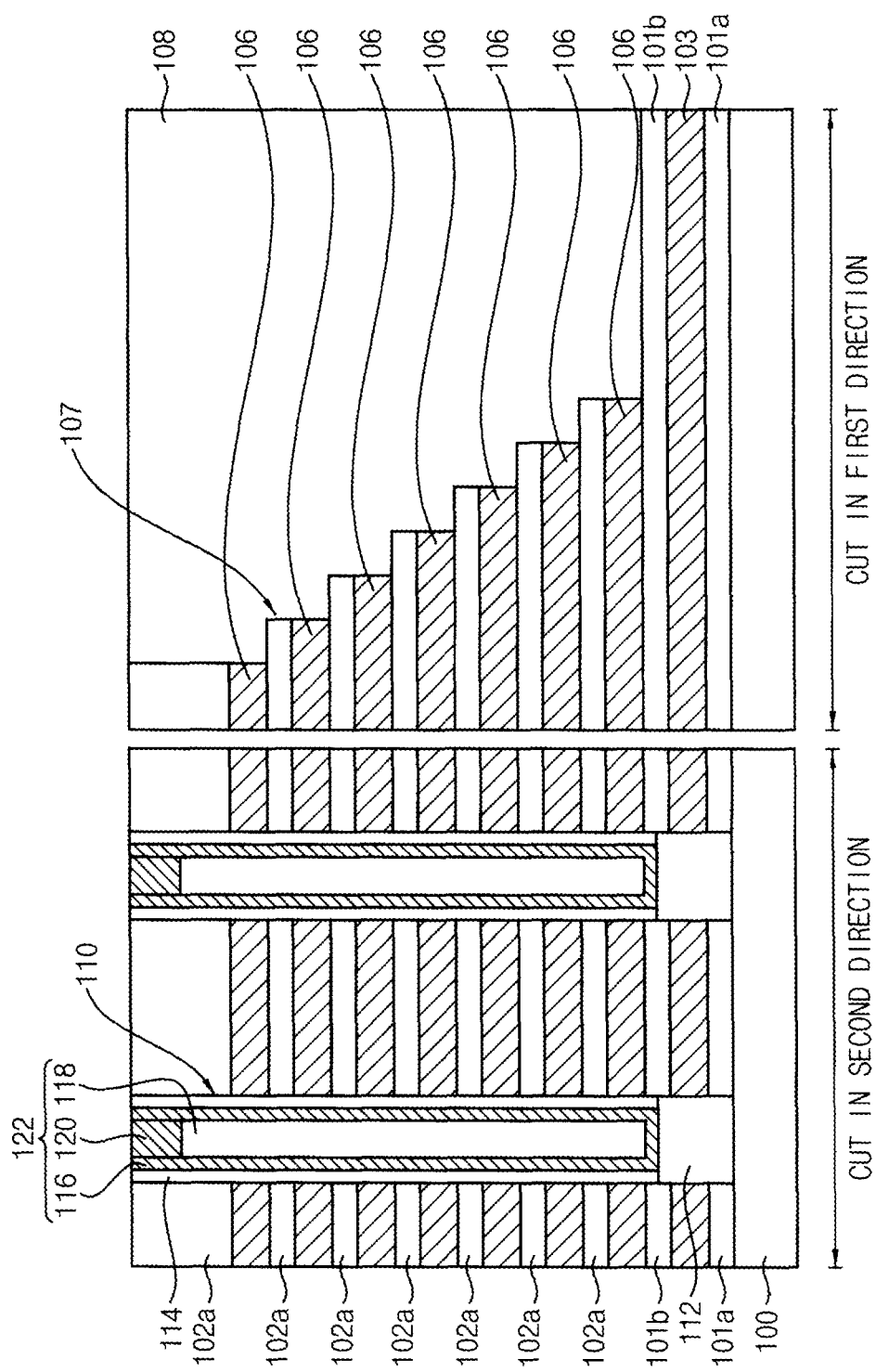

Referring to FIG. 3, a plurality of channel holes 110 exposing the upper surface of the substrate 100 through the second insulating layer 108, the first insulating layer patterns 102*a* and the sacrificial layer patterns 106 may be formed.

The channel holes 110 may be formed by forming a hard mask (not illustrated) on the uppermost first insulating layer pattern 102*a*, and then performing a dry etching process using the hard mask as an etching mask.

Due to the properties of the dry etching process, each of the channel holes 110 may be formed so as to have gradually narrowed width to downward. The channel holes 110 may be arranged in a row in the first and second directions, and a plurality of the channel holes 110 may be formed.

A semiconductor pattern 112 partially filling up the lower portion of the channel holes 110 may be formed. Particularly, the semiconductor pattern 112 partially filling up the channel holes 110 may be formed through performing a selective epitaxial growth (SEG) process using the upper surface of the exposed substrate 100 through the channel holes 110 as a seed. Accordingly, the semiconductor pattern 112 may be formed to include single crystalline silicon or single crystalline germanium according to the material of the substrate 100, and may be doped with impurities as occasion demands. In an example embodiment, the semiconductor pattern 112 may be provided as the channel region of a ground selection transistor (GST). Thus, the upper surface of the semiconductor pattern 112 may be positioned between a layer for forming a GSL and a layer for forming a word line. However, for simplifying the processing, the forming process of the semiconductor pattern 112 may be omitted.

Consequently, on the inner side wall of the channel holes 110, the upper surface of the semiconductor pattern 112 and the upper surface of the hard mask, a first blocking layer (not illustrated), a first charge storing layer (not illustrated), a first tunnel insulating layer (not illustrated) and a first channel layer (not illustrated) may be formed one by one. The first blocking layer may be formed by using an oxide such as silicon oxide, the first charge storing layer may be formed by using a nitride such as silicon nitride, and the first tunnel insulating layer may be formed by using an oxide such as silicon oxide. The first channel layer may be formed by using doped or undoped polysilicon or amorphous silicon. When the first channel layer is formed by using the amorphous silicon, an LEG process or an SPE process may be additionally performed to transform the amorphous silicon into crystalline silicon.

The bottom portions of the first channel layer, the first tunnel insulating layer, the first charge storing layer and the first blocking layer may be partially removed to expose the upper portion of the semiconductor pattern 112. Through the above described processes, a first channel layer pattern, a first tunnel insulating layer pattern, a first charge storing layer pattern and a first blocking layer pattern may be formed on the side wall of the channel hole 110. In FIG. 3, the first tunnel insulating layer pattern, the first charge storing layer pattern and the first blocking layer pattern are illustrated as one thin layer pattern 114.

A second channel layer may be formed on the first channel layer pattern. A third insulating layer filling up the inner portion of the channel hole may be formed on the second channel layer, and a planarization process may be conducted. Through the planarization process, a channel pattern 116 including the first and second channel layers may be formed. In addition, a third insulating layer pattern 118 filling up the inner portion of the channel hole 110 may be formed.

The upper portion of the third insulating layer pattern 118 may be partially removed to form a recess portion. While partially etching the third insulating layer pattern 118, the upper portions of the thin layer pattern 114 and the channel pattern 116 may be partially etched, although not illustrated. A pad pattern 120 may be formed by forming a conductive material in the recess portion.

Through performing the above described process, a pillar structure 122 including the channel pattern 116, the third insulating layer pattern 118 and the pad pattern 120 may be formed in the channel holes 110. In addition, the thin layer pattern 114 including the tunnel insulating layer pattern, the charge storing layer pattern and the first blocking layer pattern may be formed on the sidewall of the pillar structures 122.

Figure 4:
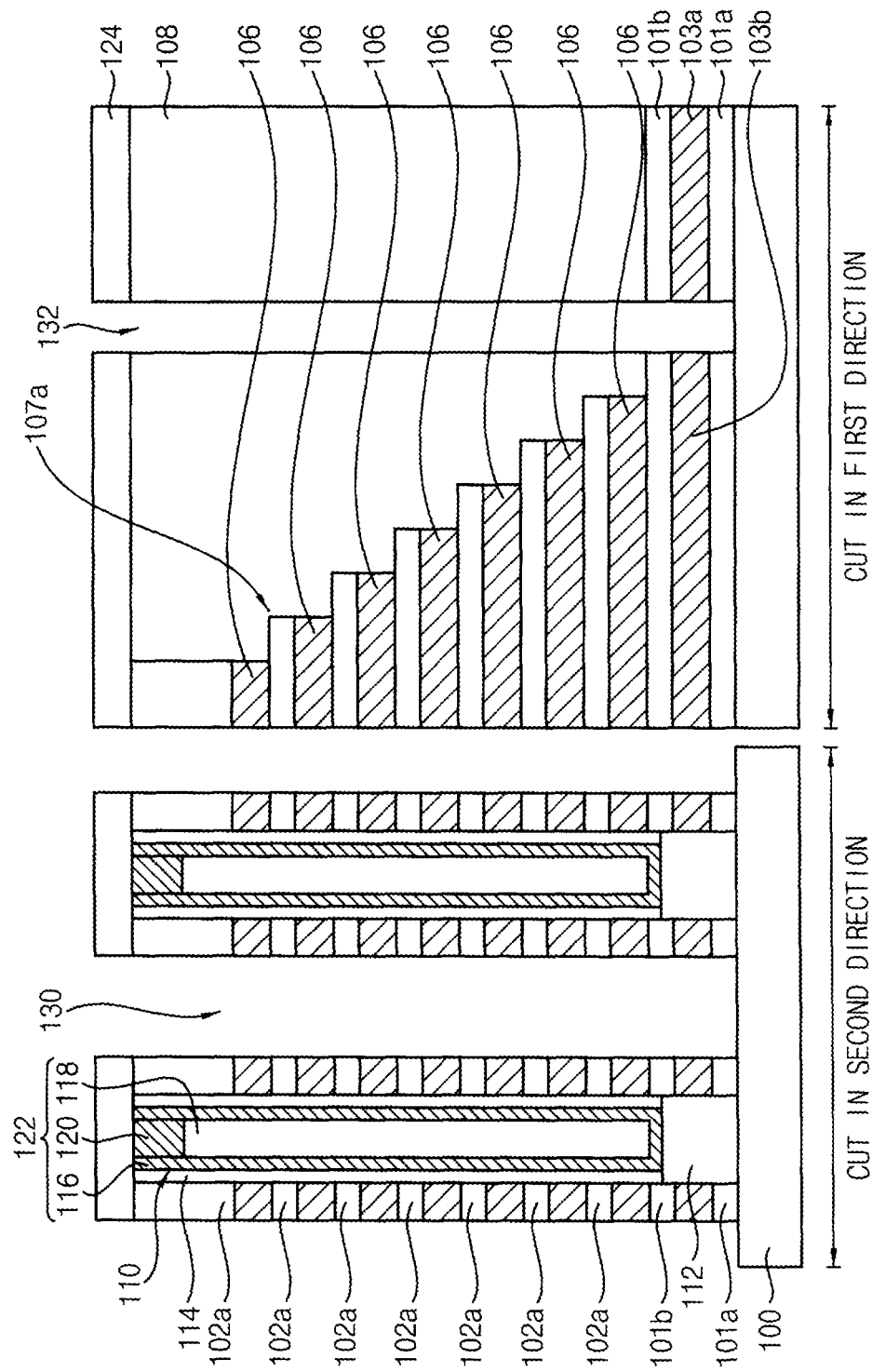

Referring to FIGS. 4 and 9, a fourth insulating layer 124 may be formed on the preliminary stepped shape pattern structure 107*a* and the second insulating layer 108 including the pillar structure 122.

Consequently, the fourth insulating layer 124, the preliminary stepped shape pattern structure 107*a*, the second insulating layer 108, the first and second lower insulating layers 101*a* and 101*b*, and the lower sacrificial layer 103 may be partially etched to respectively form first and second opening portions 130 and 132 exposing the upper surface of the substrate 100.

The first opening portions 130 may extend in the first direction. Through forming the first opening portions 130, the preliminary stepped shape pattern structures 107 may have a line shape surrounding the pillar structures 122 and extended in the first direction. The preliminary stepped shape pattern structure 107 may become a mold structure for forming word lines, GSL and SSL.

The second opening portion 132 may extend in the second direction. The second opening portion 132 may be formed in a separated portion from the side portion of the preliminary stepped shape pattern structure 107. The lower sacrificial layer 103 may be cut by the second opening portion 132, and first and second lower sacrificial layer patterns 103*a* and 103*b* facing to each other may be respectively formed.

The second lower sacrificial layer pattern 103*b* positioned under the preliminary stepped shape pattern structure may be provided as a lower step layer. Through forming the second opening portion 132, the lowermost step layer of the preliminary stepped shape pattern structure 107 may be completed to form a stepped shape pattern structure 107*a*. Meanwhile, the first lower sacrificial layer pattern 103*a* may be formed at the facing portion of the lower portion of the stepped shape pattern structure in the side direction.

As illustrated in FIG. 9, the second opening portion 132 may extend in a vertical direction to the first opening portion 130. Each of end portions of the first opening portions 130 may have an interconnecting shape with the second opening portion 132.

Figure 5:
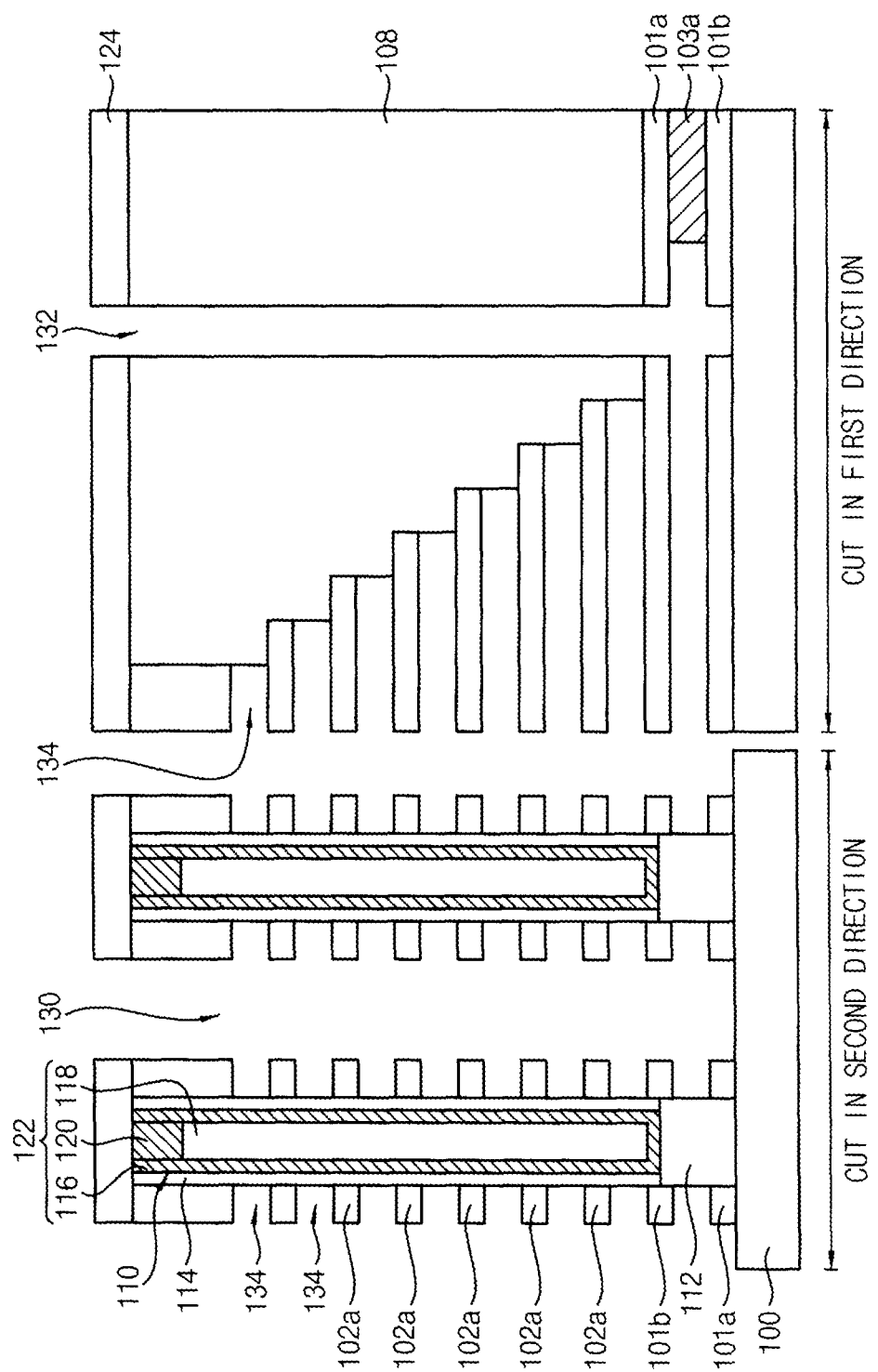

Referring to FIG. 5, the sacrificial layer patterns 106, and the first and second lower sacrificial layer patterns 103*a* and 103*b* exposed to the side walls of the first and second opening portions 130 and 132 may be removed to form gaps 134 between the first insulating layer patterns 102*a*, and between the lower insulating layers 101*a* and 101*b* at each layer. A portion of the outer side wall of the first blocking layer pattern and a portion of the side wall of the semiconductor pattern 112 may be exposed by the gaps 134. The removing process may be performed through an isotropic etching process.

In the isotropic etching process, only the sacrificial layer patterns 106 and the second lower sacrificial layer pattern 103*b* included in the stepped shape pattern structure 107*a* may be removed. Thus, the first lower sacrificial layer pattern 103*a* in the second opening portion 132 and at the facing portion to the stepped shape pattern structure 107*a* may not be completely removed but may remain on the side wall of the gap 134.

Figure 6:
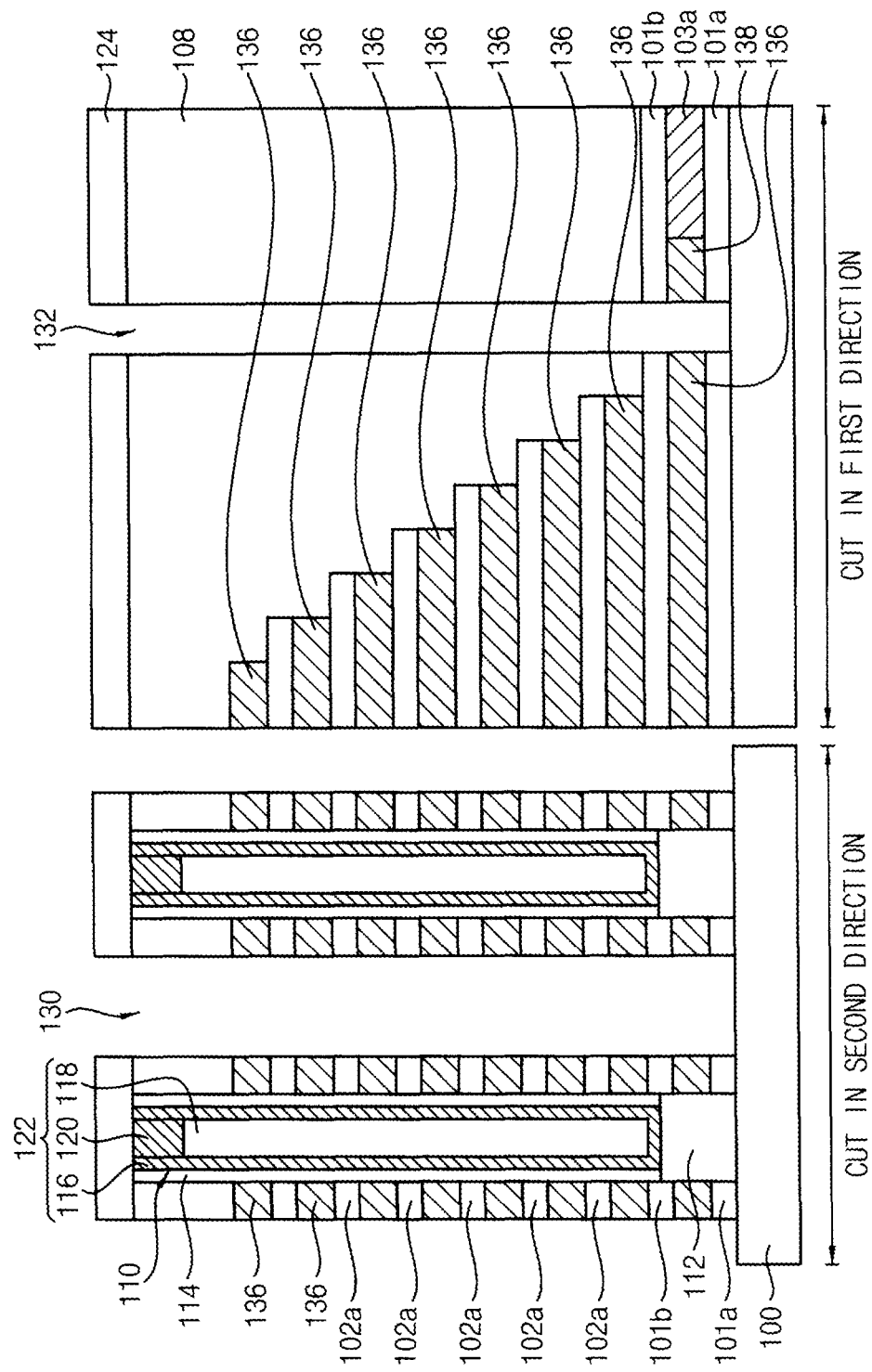

Referring to FIGS. 6 and 10, a second blocking layer (not illustrated) may be formed on the exposed surface of the gap 134. A barrier metal layer (not illustrated) may be formed on the second blocking layer. A metal layer filling up the inner portion of the barrier metal layer may be formed.

In an example embodiment, the second blocking layer may be formed by using a metal oxide, for example, aluminum oxide, hafnium oxide, lanthanum oxide, lanthanum aluminum oxide, lanthanum hafnium oxide, hafnium aluminum oxide, titanium oxide, tantalum oxide, zirconium oxide, and the like. However, the forming process of the second blocking layer may be omitted.

The barrier metal layer may be formed by using, for example, titanium, titanium nitride, tantalum, and tantalum nitride. The barrier metal layer may be formed by one compound or by stacking two or more layers using the compounds. The barrier metal layer may be formed along the surface profile of the gap 134. The gap 134 may not be completely filled up with the barrier metal layer.

The metal layer may be formed by using a metal having a low electric resistance such as tungsten. The metal layer may include, for example, tungsten.

The metal layer may be partially removed so that the metal layer may remain only in the gap 134. The metal layer formed in the first and second opening portions 130 and 132 may be removed. The removing process may include a wet etching process. Through performing the removing process, a first conductive layer pattern 136 including a barrier metal layer pattern and a metal pattern may be formed in the gap 134 portion. In addition, on the side wall in the second opening portion 132, facing the stepped shape pattern structure, a second conductive layer pattern 138 and a lower sacrificial layer pattern 103*a* may be formed.

The first conductive layer pattern 136 may be provided as SSL, word lines and GSL according to the positions thereof. Through the removing process, the first and second opening portions 130 and 132 may be formed again.

Figure 7:
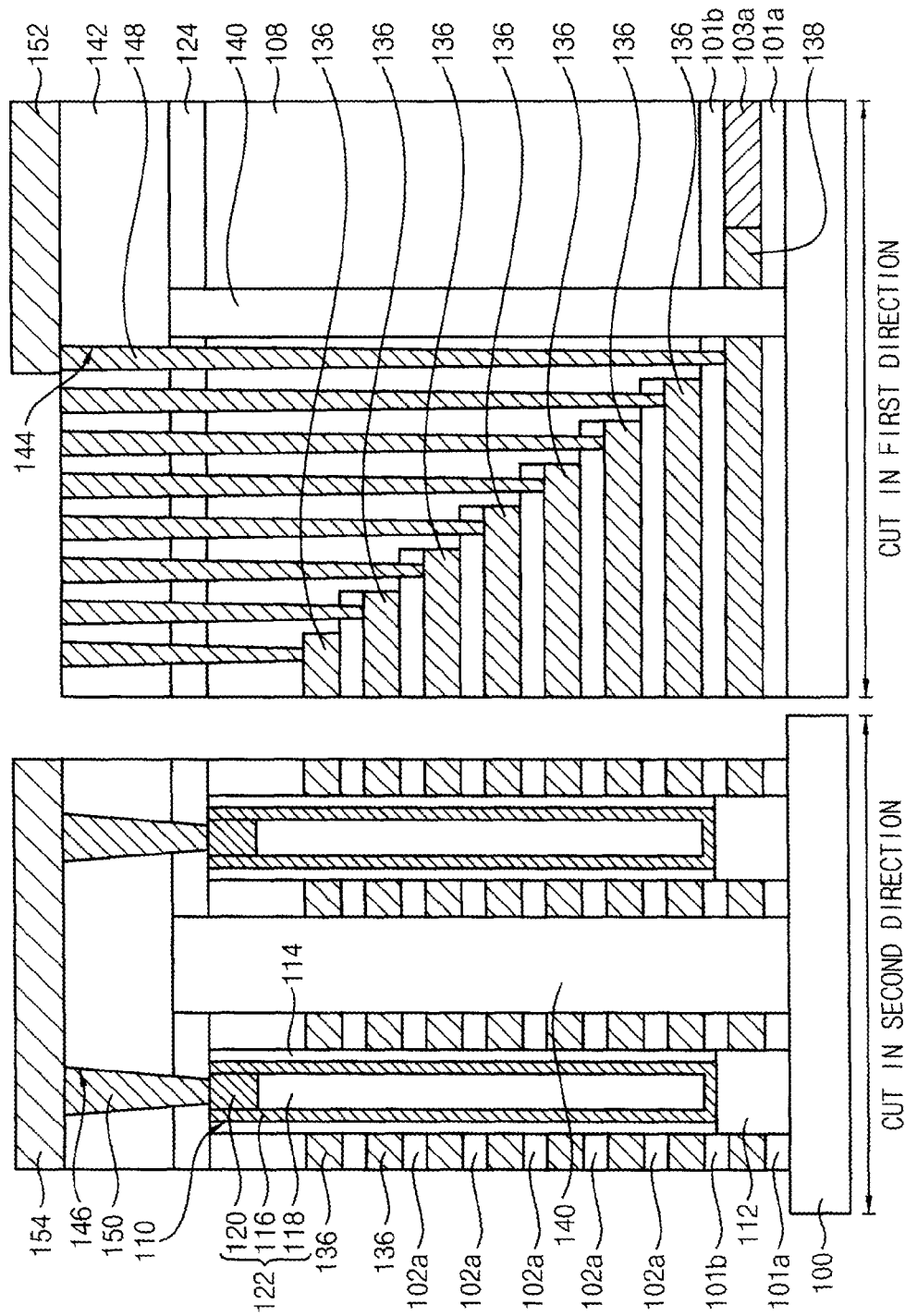

Referring to FIG. 7, a fifth insulating layer pattern 140 filling up the first opening portion 130 may be formed. To form the fifth insulating layer pattern 140, an insulating layer filling up the first and second opening portions 130 and 132 may be formed, and the insulating layer may be planarized.

A sixth insulating layer 142 may be formed on the fourth insulating layer 124 and the fifth insulating layer pattern 140. The sixth insulating layer 142, the fourth insulating layer 124 and the second insulating layer 108 may be etched to form first contact holes 144 exposing the word lines and the GSL in each layer having the stepped shape. In addition, second contact holes 146 exposing the pad pattern 120 may be formed.

A conductive layer may be formed in the first and second contact holes 144 and 146, and the conductive layer may be planarized to form first and second contact plugs 148 and 150. The conductive layer may include a metal. The conductive layer may include a barrier metal layer and a metal layer. The barrier metal layer may include, for example, titanium, titanium nitride, tantalum, and tantalum nitride. The barrier metal layer may be formed by one compound or by stacking two or more layers using the compounds. The metal layer may include, for example, tungsten.

A wiring line 152 may be formed on the first contact plug 148. The wiring line 152 may have a shape making an electric connection with the first contact plugs 148 contacting the word lines or the GSL in the same layer.

In addition, a bit line 154 may be formed on the second contact plug 150. The bit line 154 may have a line shape extended in the second direction.

As described above, the number of the steps formed while forming the stepped shape pattern structure in the manufacturing process of the vertical type memory device may be decreased. Thus, the stepped shape pattern structure may be formed through a relatively simple process. Therefore, the vertical type memory device may be easily formed.

Figure 11:
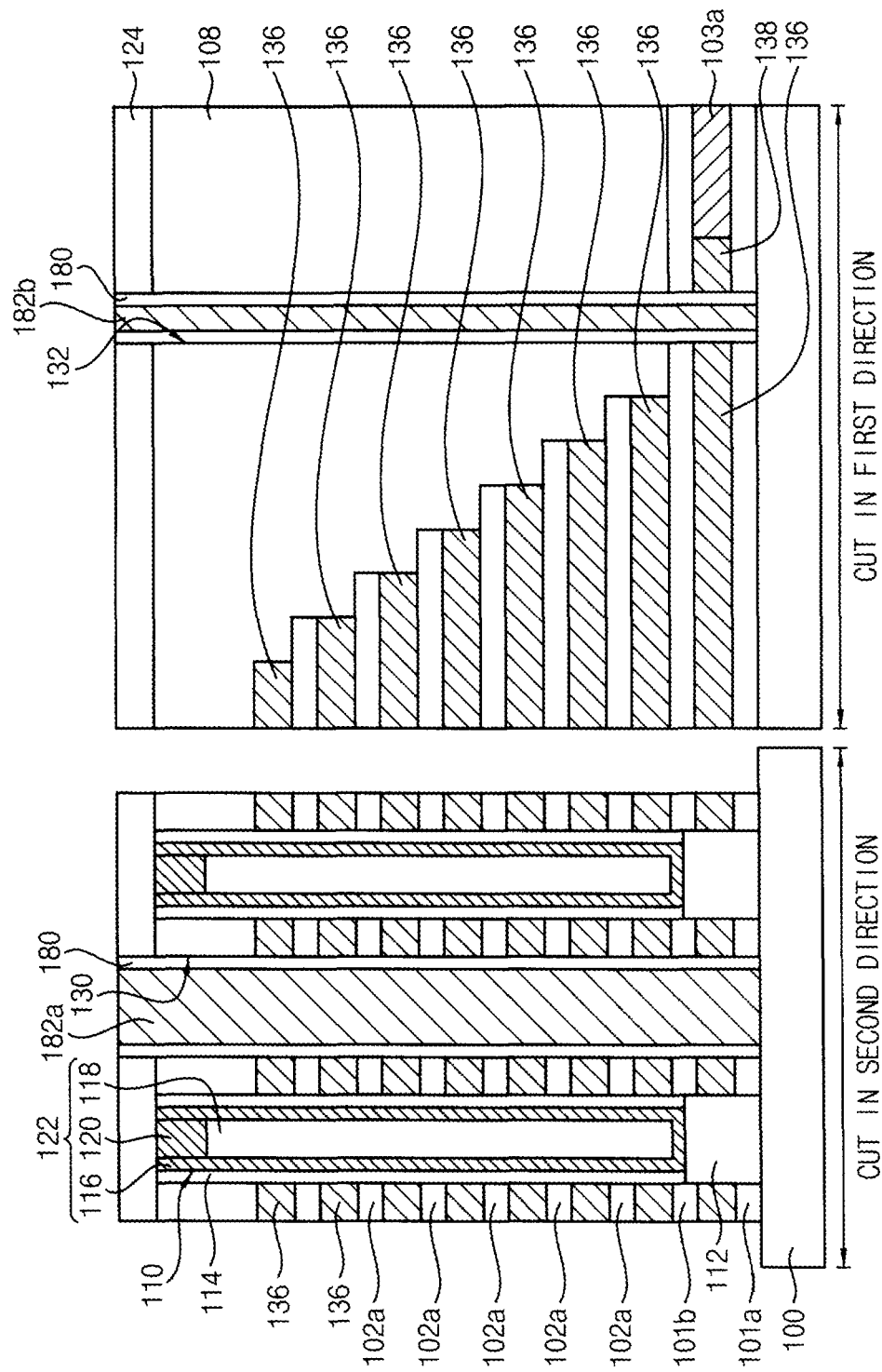
Figure 12:
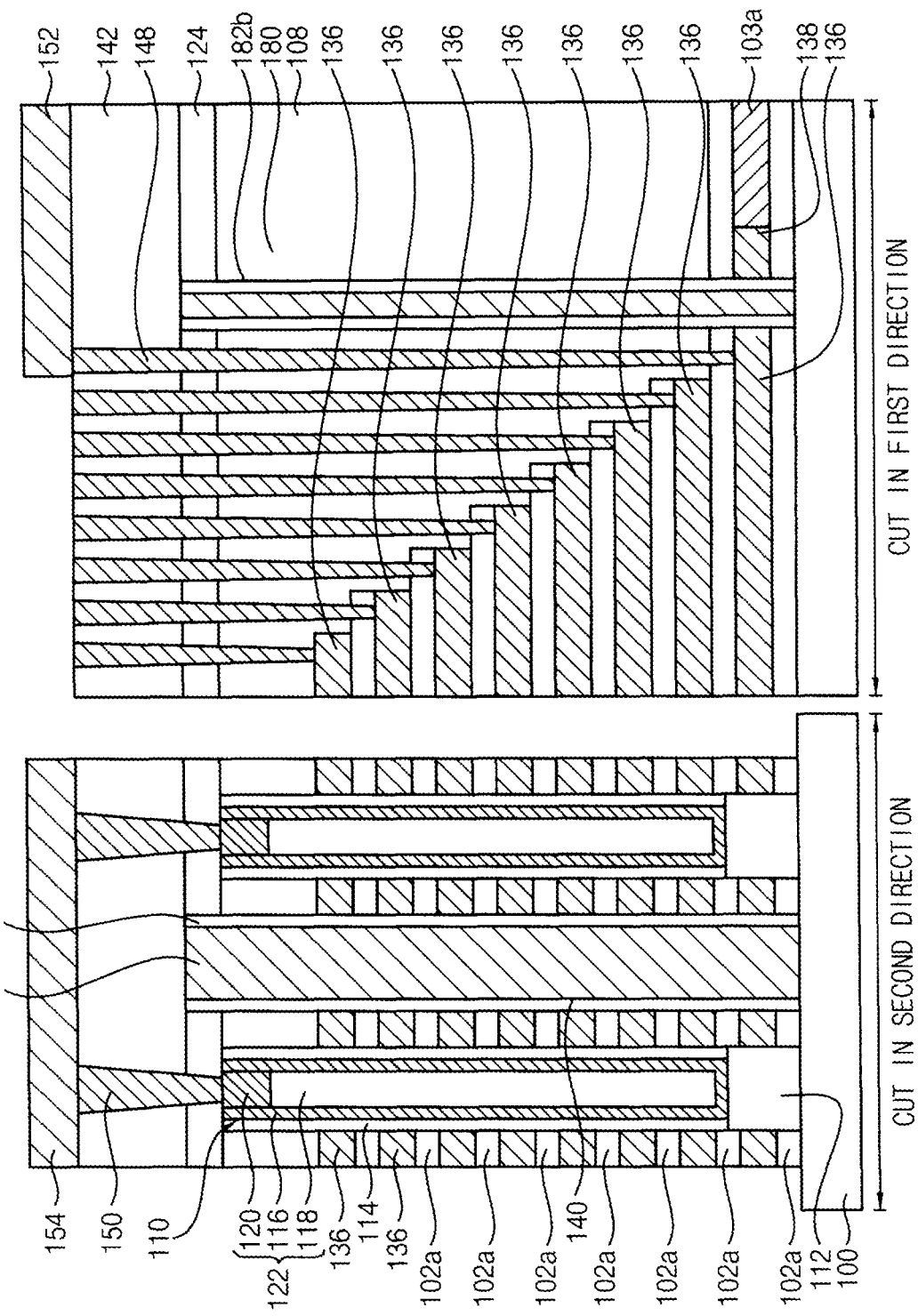

FIGS. 11 and 12 are cross-sectional views for explaining a method of manufacturing a vertical type memory device in accordance with an example embodiment of the present inventive concepts.

A vertical type memory device in accordance with this example embodiment may be same the vertical type memory device as illustrated in FIG. 7 except that CSL line may be provided.

First, through performing the processes explained referring to FIGS. 1 to 6, the structure illustrated in FIG. 6 may be formed.

Referring to FIG. 11, an insulating spacer layer may be formed along the side wall and the bottom surface of the first and second opening portions 130 and 132. The insulating spacer layer may include silicon oxide or silicon nitride. The insulating spacer layer may be anisotropically etched to expose the surface of the substrate 100 to form an insulating spacer 180 on the side walls of the first and second opening portions 130 and 132.

A conductive layer filling up in the first and second opening portions 130 and 132 may be formed. The conductive layer may include a barrier metal layer and a metal layer. The conductive layer may be planarized to form conductive patterns 182*a* and 182*b*. That is, a CSL line 182*a* extended in the first direction may be formed in the first opening portion 130. In addition, a dummy conductive line 182*b* may be formed in the second direction in the second opening portion 132.

Consequently, the same processes as those explained referring to FIG. 7 may be conducted. Thus, a first contact plug 148 and a wiring line 152 as illustrated in FIG. 12 may be formed. In addition, a second contact plug 150 and a bit line 154 may be formed.

As described above, the number of the step layers formed while forming the stepped shape pattern structure in a manufacturing process of a vertical type memory device may be decreased. Thus, the stepped shape pattern structure may be formed through simplified processes.

FIGS. 13 to 18 are cross-sectional views for explaining a method of manufacturing a vertical type memory device in accordance with another example embodiment of the present inventive concepts.

In the vertical type memory device described hereinafter, the lowermost residual sacrificial layer pattern may be used as an etch stopping layer in a peripheral circuit region.

Figure 13:
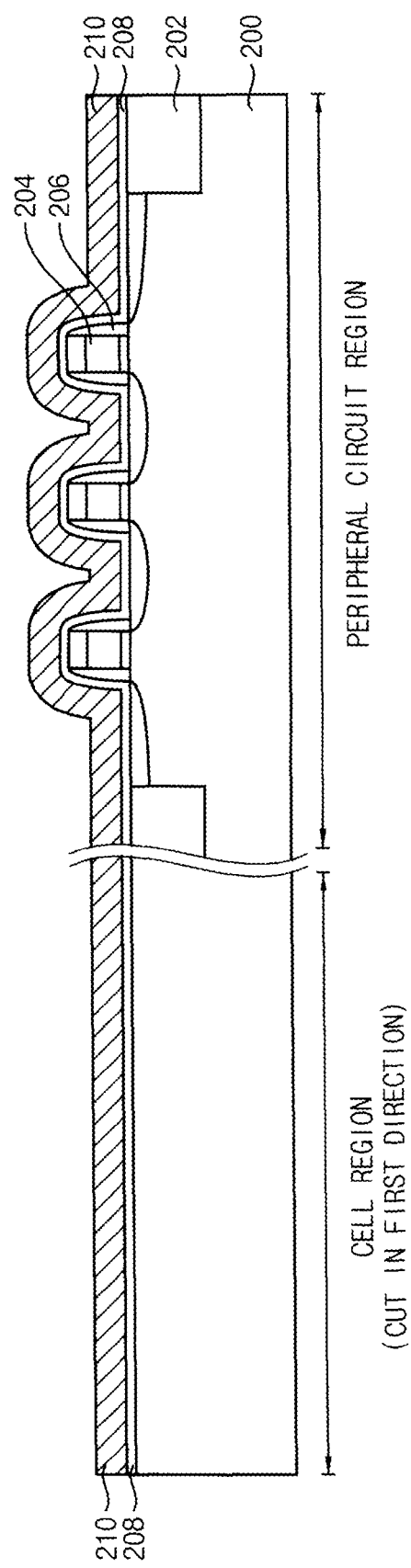

Referring to FIG. 13, a substrate 200 separated into a peripheral circuit region and a cell region may be prepared. A device isolation layer pattern 202 may be formed in the substrate 200 in the peripheral circuit region to separate an active region and a field region. MOS transistors may be formed on the substrate 200 in the active region. The MOS transistor may include a gate structure 204 and source/drain regions. Gate spacers 206 may be formed on both side walls of the gate structure 204.

A lower insulating layer 208 and an etch stopping layer 210 may be formed one by one along the surfaces of the substrate 200 in the cell region, the substrate 200 in the peripheral circuit region, the gate spacer 206 and the gate structure 204.

The lower insulating layer 208 may be formed by using silicon oxide. The etch stopping layer 210 may be formed by using silicon nitride.

The lower insulating layer 208 and the etch stopping layer 210 formed in the cell region may be formed as a stepped shape pattern structure in following processes. Thus, the etch stopping layer 210 may be formed to the same thickness as the height of the gate of a selection transistor formed at the lowermost portion in the cell region.

Figure 14:
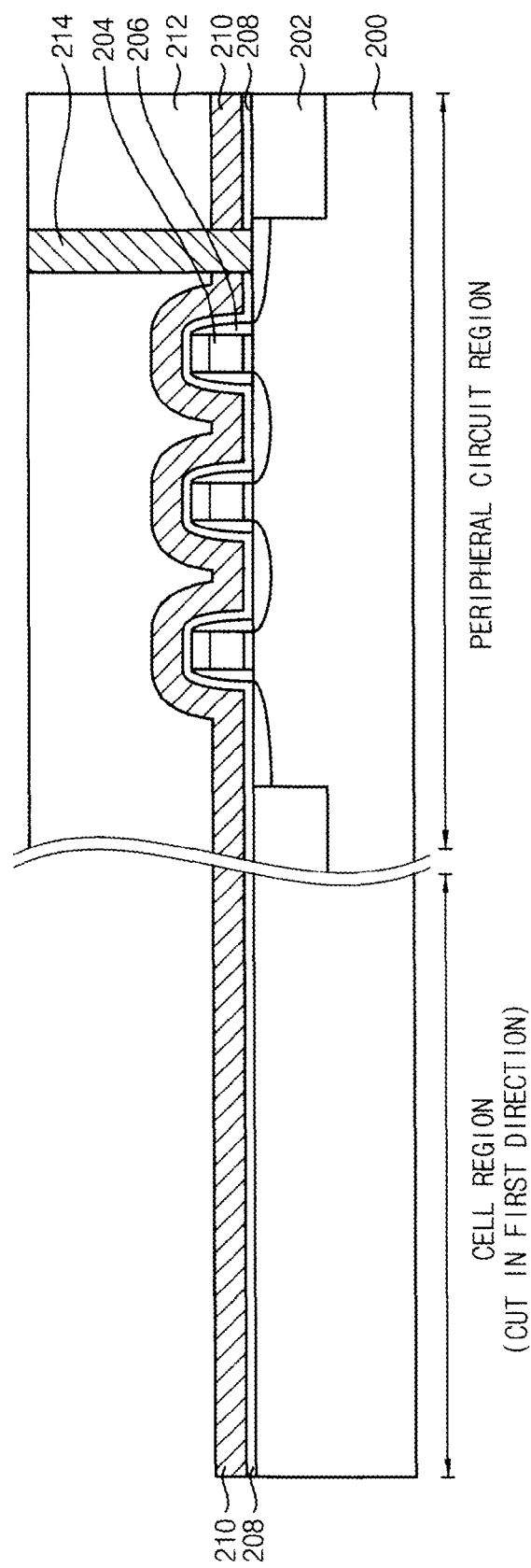

Referring to FIG. 14, an insulating interlayer covering the gate structure may be formed on the etch stopping layer 210. The insulating interlayer may be partially etched to form a contact hole. A conductive material may be formed in the contact hole, and a planarization process may be conducted to form a lower contact 214 making an electric connection with the MOS transistor.

A cell opening etching mask pattern (not illustrated) for selectively exposing the cell region may be formed. The etching mask pattern may be a photoresist pattern. By using the etching mask, the insulating interlayer formed in the cell region may be etched. Thus, the etch stopping layer 210 in the cell region may be exposed. In addition, an insulating interlayer pattern 212 may be formed in the peripheral circuit region.

Figure 15:
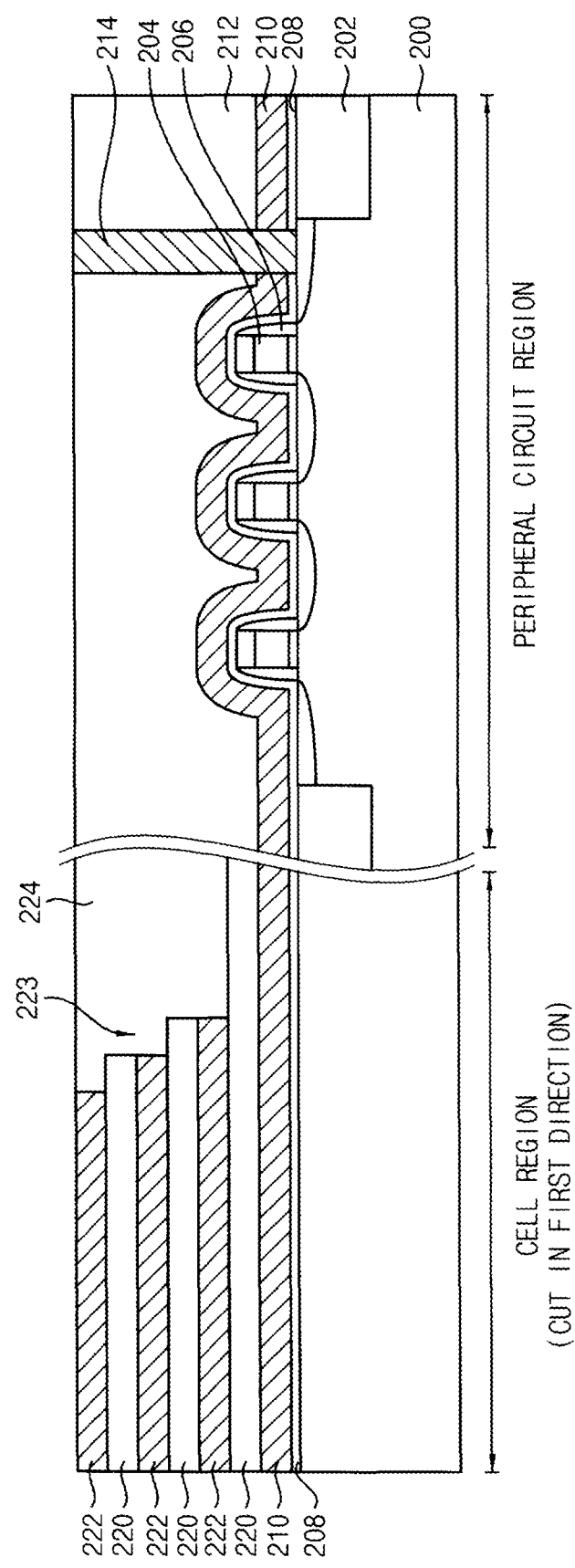

Referring to FIG. 15, first insulating layers and first sacrificial layers may be repeatedly formed on the etch stopping layer 210 and the insulating interlayer pattern 212. In this case, the first insulating layers and the first sacrificial layers may be formed so that the height of the upper surface of the stacked structure of the first insulating layers and the first sacrificial layers formed in the cell region may be nearly the same as the height of the upper surface of the insulating interlayer pattern 212 in the peripheral circuit region.

A photolithography process may be conducted with respect to the stacked first insulating layers and the first sacrificial layers to form a first preliminary stepped shape pattern structure 223 having a stepped shape at the edge portion in the cell region. A first preliminary stepped shape pattern structure 223 may have a stacked shape of first sacrificial layers 222 and first insulating layers 220.

In this case, the lower insulating layer 208, the etch stopping layer 210 and one layer of the first insulating layer 220 formed on the etch stopping layer 210 may not be etched. That is, the etch stopping layer 210 may not be patterned to the stepped shape but may remain to maintain the totally deposited state. The first preliminary stepped shape pattern structure 223 may have an unfinished shape of the lowermost stepped pattern.

In the etching process, all of the first insulating layers and the sacrificial layers formed in the peripheral circuit region may be removed. Thus, the insulating interlayer pattern 212 in the peripheral circuit region may be exposed.

A second insulating layer 224 filling up the gap portion formed at the side portion of the first preliminary stepped shape pattern structure 223 may be formed. The second insulating layer 224 may be planarized to expose the upper surface of the first preliminary stepped shape pattern structure 223 and the insulating interlayer pattern 212. Thus, the upper surface of the first preliminary stepped shape pattern structure 223 may be positioned at the nearly same plane as the upper surface of the insulating interlayer pattern 212.

Referring to FIG. 16, third insulating layers and the second sacrificial layers may be repeatedly formed on the first preliminary stepped shape pattern structure 223, the second insulating layer 224 and the insulating interlayer pattern 212.

Through conducting a photolithography process with respect to the third insulating layers and the second sacrificial layers, a second preliminary stepped shape pattern structure 229 having a stepped shape edge portion may be formed. The second preliminary stepped shape pattern structure 229 may be provided on the first preliminary stepped shape pattern structure 223, so as to have a continuous stepped shape from the first preliminary stepped shape pattern structure 223. The second preliminary stepped shape pattern structure 229 may have a stacked shape of second sacrificial layer patterns 228 and third insulating layer patterns 226.

A fourth insulating layer 230 covering the second preliminary stepped shape pattern structure 229 may be formed and planarized.

Through performing the above-described process, a preliminary stepped shape pattern structure having the same structure as that illustrated in FIG. 2 may be formed in the cell region.

Referring to FIG. 17, a pillar structure (not illustrated) may be formed with respect to the preliminary stepped shape pattern structure. The pillar structure forming process may be the same as that explained in FIG. 3.

The fourth insulating layer 230, the second insulating layer 224, and the first and second preliminary stepped shape pattern structures 223 and 229 may be partially etched to form first and second opening portions 240 exposing the upper surface of the substrate 200. The first opening portions may have a trench shape extended in the first direction as illustrated in FIG. 4. Thus, the first opening portions are not illustrated in the cross-sectional view of FIG. 17.

The second opening portion 240 may be formed by etching the fourth insulating layer 230, the second insulating layer 224, the lower first insulating layer 220, the etch stopping layer 210 and the lower insulating layer 208. The etch stopping layer 210 may be cut by the second opening portion 240. Thus, the lowermost step layer of the first and second preliminary stepped shape pattern structures may be completed to form a stepped shape pattern structure 242. In addition, an etch stopping layer pattern 210a may be formed in the peripheral circuit region.

Referring to FIG. 18, the same processes as explained referring to FIGS. 5 to 7 may be performed.

That is, the sacrificial layer patterns exposed to the side wall of the first and second opening portions 240 may be removed, and a conductive layer pattern 250 may be formed at a portion where the sacrificial layer patterns have been removed. In addition, a fifth insulating layer pattern 244 may be formed in the second opening portion 240.

A sixth insulating layer 252 may be formed on the fourth insulating layer 230 and the fifth insulating layer pattern 244. Consequently, contact plugs 254 making respective contact with the conductive layer patterns 250 may be formed. In addition, wiring lines 256 making an electric connection with the contact plugs 254 may be formed.

Through conducting the above-described processes, the vertical type memory device illustrated in FIG. 18 may be formed.

In the manufacturing process of the vertical type memory device, the total number of the steps formed while forming the stepped shape pattern structure may be decreased. Thus, the vertical type memory device may be easily formed.

The vertical type memory device in accordance with example embodiments may be used in a vertical type non-volatile memory device. Particularly, the vertical type non-volatile memory device may be manufactured through a simplified process in accordance with example embodiments.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A vertical memory device, comprising:
    a pillar structure on a substrate, the pillar structure including a channel pattern extending in a vertical direction from a top surface of the substrate;
    a plurality of conductive layer patterns surrounding outer sidewalls of the pillar structure, the conductive layer patterns stacked in the vertical direction to be spaced apart from each other, each of the conductive layer patterns extending in a first direction substantially parallel to the top surface of the substrate; and
    a lower sacrificial layer pattern on the substrate, the lower sacrificial layer pattern and a sidewall in the first direction of a lowermost conductive layer pattern of the conductive layer patterns being spaced apart from each other and facing each other.

2. The vertical memory device of claim 1, further comprising:
    an insulating interlayer formed at a space between the conductive layer patterns and on the conductive layer patterns and the lower sacrificial layer pattern.

3. The vertical memory device of claim 2, wherein the lower sacrificial layer pattern includes a material having an etching selectivity with respect to the insulating interlayer.

4. The vertical memory device of claim 1, wherein the lower sacrificial layer pattern includes silicon nitride.

5. The vertical memory device of claim 1, wherein the lower sacrificial layer pattern extends in a second direction substantially perpendicular to the first direction.

6. The vertical memory device of claim 1, wherein the lower sacrificial layer pattern has a thickness substantially the same as a thickness of one of the conductive layer patterns.

7. The vertical memory device of claim 1, wherein top surfaces of the lower sacrificial layer pattern and the lowermost conductive pattern of the conductive layer patterns are coplanar with each other.

8. The vertical memory device of claim 1, further comprising:
    a lower dummy conductive line on a sidewall of the lower sacrificial layer pattern.

9. The vertical memory device of claim 8, wherein the lower dummy conductive line and a sidewall in the first direction of a lowermost conductive layer pattern of the conductive layer patterns are spaced apart from each other and facing each other.

10. The vertical memory device of claim 8, wherein the lower dummy conductive line extends in a second direction substantially perpendicular to the first direction.

11. The vertical memory device of claim 8, wherein the lower dummy conductive line includes a material substantially the same as a material of the conductive layer patterns.

12. The vertical memory device of claim 8, wherein the lower dummy conductive line and the conductive layer patterns include a metal.

13. The vertical memory device of claim 1, further comprising:
    a common source line spaced apart from the conductive layer patterns,
    wherein the common source line is on the substrate between the conductive layer patterns in a second direction substantially perpendicular to the first direction.

14. The vertical memory device of claim 13, further comprising:
    an insulating spacer on a sidewall of the common source line.

15. The vertical memory device of claim 1, further comprising:
    contact plugs connected to the conductive layer patterns; and
    wiring lines interconnecting the contact plugs.

16. The vertical memory device of claim 1, further comprising:
    a lower insulating layer on the substrate.

17. A vertical memory device, comprising:
    a pillar structure on a first region of a substrate, the pillar structure including a channel pattern extending in a vertical direction from a top surface of the substrate;
    a plurality of conductive layer patterns surrounding outer sidewalls of the pillar structure, the conductive layer patterns stacked in the vertical direction to be spaced apart from each other, each of the conductive layer patterns extending in a first direction substantially parallel to the top surface of the substrate;
    a transistor on a second region of the substrate, the transistor including a gate structure; and
    an etch stopping layer on the gate structure in the second region of the substrate, the etch stopping layer having a thickness substantially the same as a thickness of a lowermost conductive layer pattern of the conductive layer patterns.

18. The vertical memory device of claim 17, further comprising:
    a lower sacrificial layer pattern on the first region of the substrate, the lower sacrificial layer pattern and a sidewall in the first direction of a lowermost conductive layer pattern of the conductive layer patterns being spaced apart from each other and facing each other; and
    an insulating interlayer formed at a space between the conductive layer patterns and on the conductive layer patterns and the lower sacrificial layer pattern.

19. The vertical memory device of claim 18, wherein the lower sacrificial layer pattern includes a material having an etching selectivity with respect to the insulating interlayer.

20. The vertical memory device of claim 18, wherein the lower sacrificial layer pattern includes silicon nitride.

* * * * *